United States Patent [19]

Furmanak et al.

[11] Patent Number: 5,062,681

[45] Date of Patent: Nov. 5, 1991

[54] SLOT-COUPLING OF OPTICAL WAVEGUIDE TO OPTICAL WAVEGUIDE DEVICES

[75] Inventors: Robert J. Furmanak, Wilmington, Del.; Bruce L. Booth, West Chester; Thomas K. Foreman, Sayre, both of Pa.

[73] Assignee: E. I. du Pont de Nemours and Company, Wilmington, Del.

[21] Appl. No.: 521,056

[22] Filed: May 2, 1990

[51] Int. Cl.⁵ .............................................. G02B 6/24
[52] U.S. Cl. ...................................... 385/50; 385/39; 385/55
[58] Field of Search ............... 350/96.12, 96.11, 96.15, 350/96.21

[56] References Cited

U.S. PATENT DOCUMENTS

| | | | |
|---|---|---|---|
| 4,472,020 | 9/1984 | Evanchuk | 350/96.12 |
| 4,691,983 | 9/1987 | Kobayashi et al. | 350/96.12 |
| 4,846,540 | 7/1989 | Kapon | 350/96.12 |
| 4,883,743 | 11/1989 | Booth et al. | 350/96.12 |

Primary Examiner—John D. Lee
Assistant Examiner—Phan T. Heartney

[57] ABSTRACT

An optical waveguide device adaptable to be coupled with a similar optical waveguide device through commensurate slots on the devices, the slots guiding the ends of the respective waveguides into contact with each other, and into properly aligned optical coupling.

33 Claims, 10 Drawing Sheets

SLOT-COUPLING OF OPTICAL WAVEGUIDE TO OPTICAL WAVEGUIDE DEVICES

FIELD OF THE INVENTION

This invention relates to optical waveguide devices capable of being coupled with each other through matching slots on each device. This greatly facilitates the alignment of the waveguides. The instant invention also relates to methods of making such optical devices.

BACKGROUND OF THE INVENTION

In optical communication systems, messages are transmitted typically through optical fibers by carrier waves of optical frequencies that are generated by sources, such as lasers or light emitting diodes. There is much current interest in such optical communication systems because they offer several advantages over other communication systems, such as having a greatly increased number of channels of communication and the ability to use other materials besides expensive copper cables for transmitting messages.

As the development of optical circuits proceeded, it became necessary to have optical waveguide devices which could couple, divide, switch and modulate the optical waves from one optical fiber to another, or from one waveguide device to another. For example devices see U.S. Pat. Nos. 3,689,264, 4,609,252 and 4,637,681.

Connecting optical devices to one another has traditionally been a problem. One method is to fuse or melt fibers or other configurations, for example, together so that light from one fiber or configuration can pass to the connected fibers or configurations. However, in such a fusion process it is difficult to control the extent of fusion and the exact geometry and reproducibility of the final structure.

SUMMARY OF THE INVENTION

The instant invention is directed to optical waveguide devices capable of being coupled with each other through matching slots on each device. This greatly facilitates the alignment of the waveguides.

More particularly, this invention pertains to an optical waveguide device adaptable to be connected to a similar optical waveguide device, comprising: terminal edge; a first pair of opposite external surfaces, substantially parallel to each other, and extending away from the terminal edge; and a waveguide positioned equidistantly between the first pair of the opposite external surfaces, and having an end point and a center axis, the center axis forming an angle greater than zero with the terminal edge; the device also having a thickness, and a through-slot extending in a direction substantially parallel to the direction of the waveguide, the through-slot starting at the terminal edge and extending adequately within the device as to meet the end of the waveguide, the through-slot having a width, and a center axis coinciding with the center axis of the waveguide, the through-slot confined by a second pair of opposite side surfaces, substantially parallel to each other and to the center axis of the waveguide, and substantially perpendicular to the first pair of surfaces with the requirement that the width of the through-slot is not excessively smaller than the thickness of the matching device; and an internal surface meeting with and being substantially perpendicular to the first and the second pairs of surfaces, the internal surface having a center point, the center point coinciding with the end of the waveguide, so that when the through-slot of the optical waveguide device is coupled with a similar slot of a second similar device, the ends of the respective waveguides come in contact, and the center axes of the waveguides substantially coincide.

Preferably, the width of the through-slot is adequately smaller than the thickness of the device, so that when the optical waveguide device is connected to a similar device through coupling of their respective through-slots, a tight and secure fit is created. Also preferably, the optical waveguide device comprises a laminate of a middle photopolymer layer containing the waveguide, and two external photopolymer layers having the same thickness.

The instant invention also relates to methods of making such optical devices. More particularly it pertains to a method of coupling two optical waveguide devices, each optical device having a terminal edge, a first pair of opposite surfaces substantially parallel to each other, and a waveguide positioned equidistantly between the opposite surfaces, the waveguide having a center axis forming an angle with the terminal edge different from zero, comprising the steps of: forming a through-slot in a direction substantially parallel to the direction of the waveguide, the through-slot starting at the terminal edge of each device and extending adequately within the device to remove at least part of the waveguide and form an end on the waveguide, in a way that the through-slot has a center axis coinciding with the center axis of the waveguide, and a second pair of opposite side surfaces, substantially parallel to each other and to the center axis of the waveguide, and substantially perpendicular to the first pair of surfaces with the requirement that the width of the through-slot is not excessively smaller than the thickness of the device, and an internal surface meeting with and being perpendicular to the second pair of surfaces, the internal surface having a center point, the center point coinciding with the end of the waveguide; and, inserting the slot of one device into a similar slot of a second device in a way that the ends of the respective waveguides come in contact, and the center axes of the waveguides substantially coincide. It is preferable to adhere the respective waveguide ends of the two devices to each other with an adhesive photopolymer composition.

DESCRIPTION OF THE DRAWING

The reader's understanding of practical implementation of preferred embodiments of the invention will be enhanced by reference to the following detailed description taken in conjunction with perusal of the drawing figures, wherein.

DETAILED DESCRIPTION OF THE INVENTION

Figure 1:
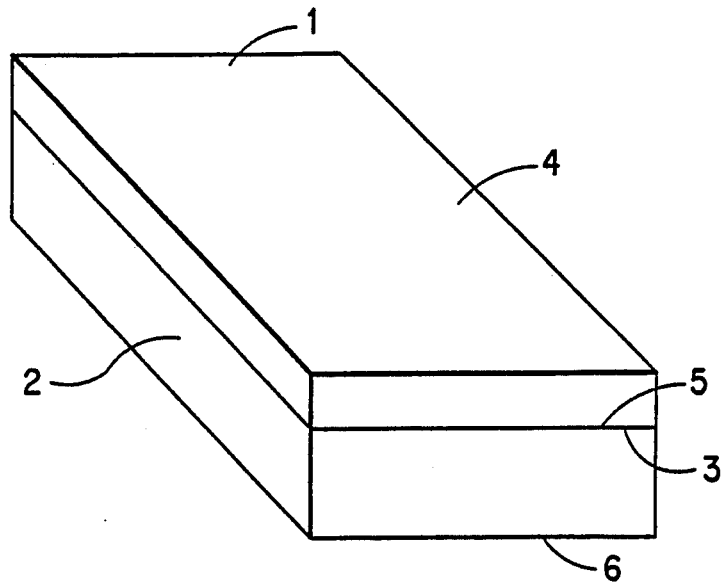
FIG. 1 is a perspective view of a photohardenable film removably adhered to a support.

This invention pertains to optical waveguide devices capable of being coupled with each other through special matching slots on each device. This greatly facilitates the alignment of the waveguides embedded in different devices and alleviates the need for accurate and very expensive equipment, which is otherwise required for the waveguide alignment. The instant invention also relates to methods of making such optical devices.

Although any type of optical waveguide devices having the waveguide embedded equidistantly from their outside surfaces may be used in accordance with this invention, the devices described in the detailed discussion of FIGS. 1–11 lend themselves to inherently more accurate positioning of a waveguide regarding the "equidistance" requirement, and therefore they are preferred. The through-slots, which are carved according to the instant invention on the optical waveguide devices are described in the discussion of FIGS. 12 and 13.

It should be understood that although the Figures illustrate only elementary optical waveguide devices for simplicity purposes, the degree of complexity of the individual devices does not have adverse consequences with regard to the present invention.

Throughout the following detailed description, similar reference numerals refer to similar parts in all Figures of the drawing. In addition, the word "element" is used to denote a constituent of a final optical waveguide device.

Referring to FIG. 1, an element is illustrated comprising a substantially dry photohardenable film 1 removably adhered to a support 2. The film 1 has a first surface 3 and a second surface 4. The support similarly has a first surface 5 and a second surface 6. The first surface 5 of the support 2 is removably adhered to the first surface 3 of the film 1. The surfaces 3, 4, 5 and 6 of the film 1 and the support 2 are preferably substantially flat.

The film 1 may have a thickness in the range of 2 micrometers through 15 micrometers or above, preferably in the range of 4.5 micrometers through 8.0 micrometers, and more preferably about 5.3 micrometers.

Figure 2A:
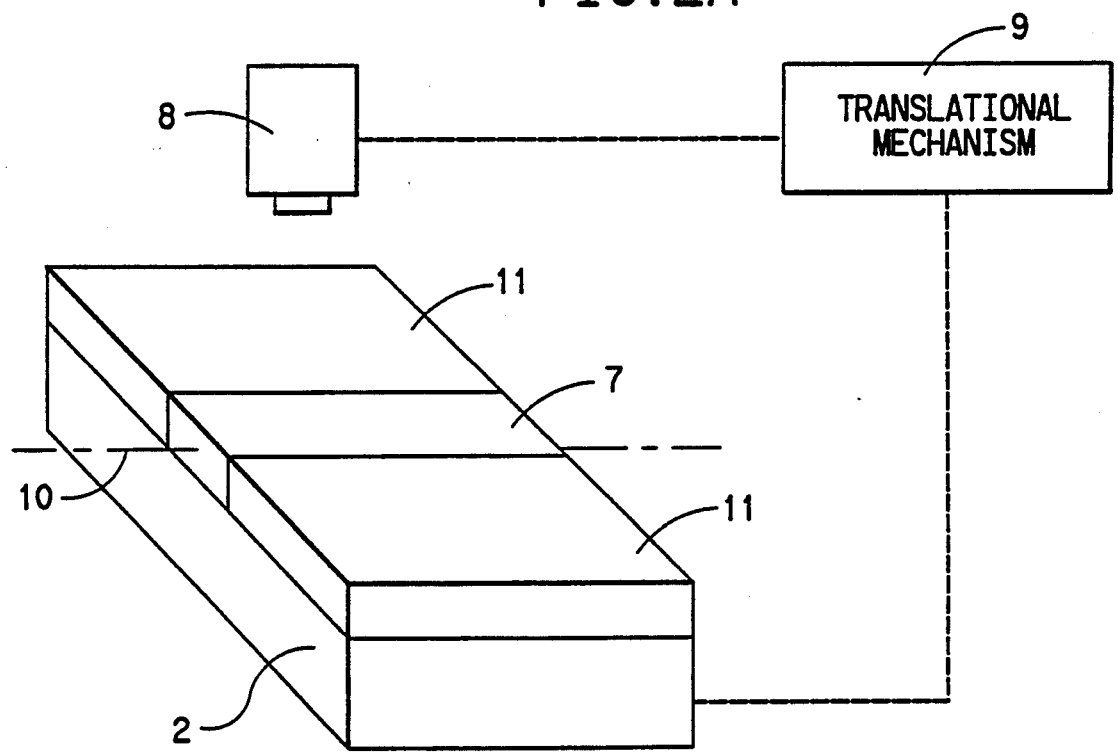
FIG. 2a is a schematic representation of a preferred way for forming an optical waveguide in a film on a support.
Figure 2B:
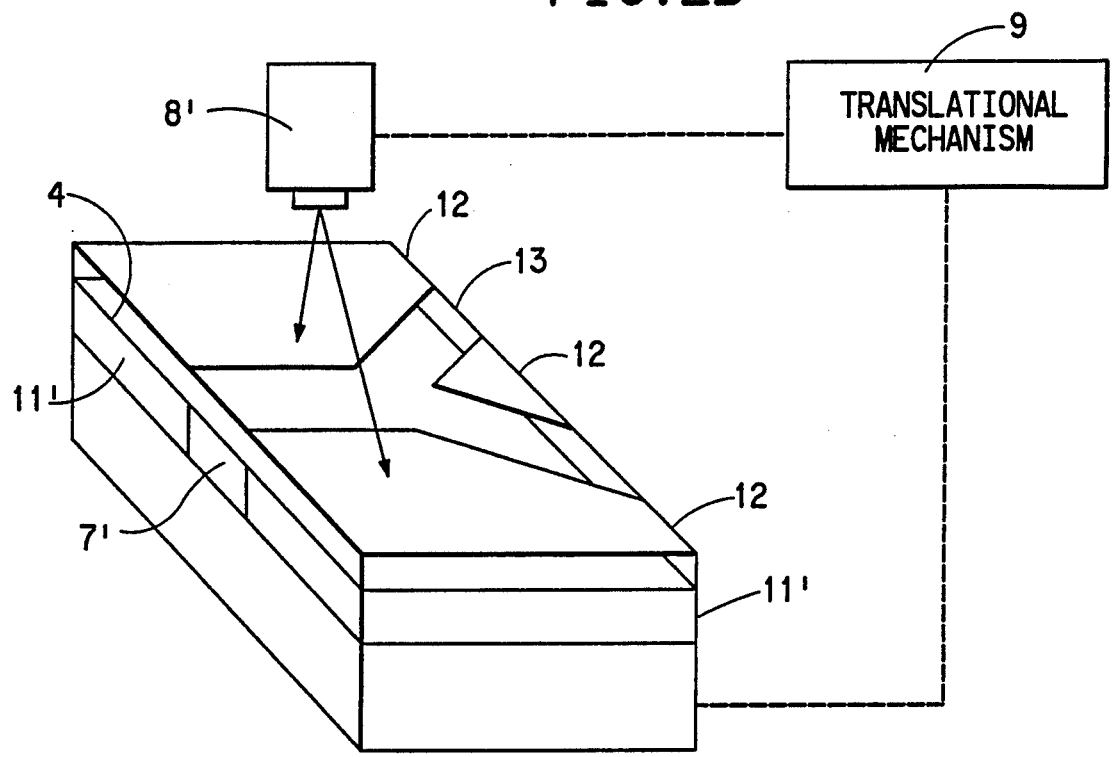
FIG. 2b is a schematic representation of a second preferred way for forming an optical waveguide having a Y configuration in a film on a support.
Figure 2C:
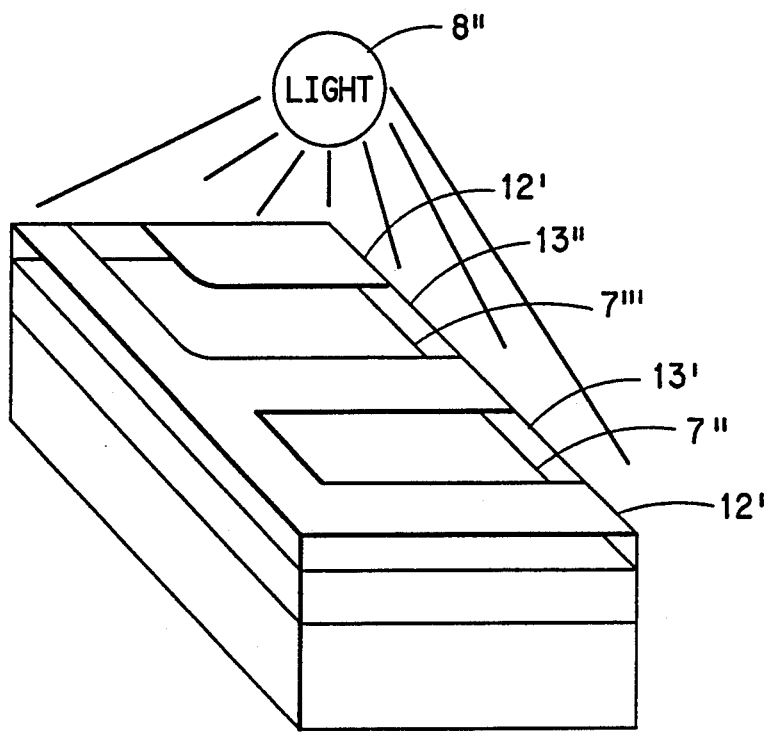
FIG. 2c is a schematic representation of a third preferred way for forming an optical waveguide having a different configuration in a film on a support.

Referring to FIGS. 2a, 2b, and 2c, the first step of the method of of making the preferred devices according to the present invention comprises exposing to light at least a first region 7 of the film 1 polymerizing at least one monomer in the film 1 and changing the refractive index of the region 7 to form at least a first optical waveguide. The term waveguide is defined by those skilled in this art to include the entire area that transmits radiant energy. This technically includes some area just around the exposed region can by considered to substantially be the waveguide. In theory, the waveguide formation is believed to be due to a self-focusing property of the film material. Upon exposure to light, a polymerization reaction is induced in the exposed region. It is believed that there is interdiffusion between the exposed and unexposed regions, at least near the interface of these regions.

This interdiffusion changes and typically increases the density of the exposed region raising its refractive index creating a lens-like exposed region directing the light in a self focused fashion to create a narrow smooth walled waveguide of approximately the same dimension as a mask area or light beam width. Three ways for performing this first step are illustrated in FIGS. 2a, 2b and 2c.

In FIG. 2a, a focused laser light source 8 exposes the region 7 to form the waveguide. A translational mechanism 9 is connected to the laser light source 8 and/or the support 2 for moving the laser light source 8, the support 2 or both, to create the waveguide having a desired and/or predetermined pattern. Here, the exposed region 7 has a substantially elongated box configuration having an optical axis 10 through the the longitudinal center of the region 7. A physical cross section of the exposed region 7 perpendicular to the optical or center axis 10 is substantially rectangular. On both sides of the region 7 are remaining unexposed regions 11 of the film 1.

FIG. 2b shows an alternate way for exposing a region 7'. Here, a non-focused laser light source 8' is generally directing actinic radiation toward the element of FIG. 1. An opaque mask 12 is positioned between the laser light source 8 and the film 1, typically contacting and covering the second film surface 4. The mask 12 has at least a patterned area 13 therein through which actinic radiation from the light source 8' exposes region 7'. The patterned area can have any desired configuration, including the substantially Y configuration shown in FIG. 2b.

Exposing the region 7' through this area 13, results in the creation of a waveguide having a substantially Y configuration. Described more generically, the region can have one end adapted to inlet or outlet light connected to a plurality of ends (e.g., 2, 3, 4 . . .) adapted to inlet or outlet light. As in the FIG. 2a case, there are remaining unexposed regions 11' in the film 1.

A third way for performing the exposing step of the present method is illustrated in FIG. 2c. Here, actinic radiation from a light source 8" exposes a first region 7" and a second region 7'" of the film 1 through an opaque mask 12'. This mask 12' has first and second areas 13' and 13" for the light to pass through exposing regions 7" and 7"', respectively. The second area 13" approaches and is in part parallel to the first area 13'. Thus, after exposure, the exposed second region 7"' and the corresponding waveguide. As a result, the waveguides can be positioned to exhibit evanescent coupling of light injected into one of the waveguides by gradually leaking or coupling the injected light into the other waveguide.

In each of these preferred ways, after exposure, the first and second surfaces 3 and 4 of the film 1 remain substantially flat. This facilitates subsequent laminating of layers on the film surfaces. As such, FIGS. 2a, 2b and 2c illustrate the making of optical waveguide elements, useful in making optical waveguide devices, which in turn are useful in integrated optical systems.

Figure 3:
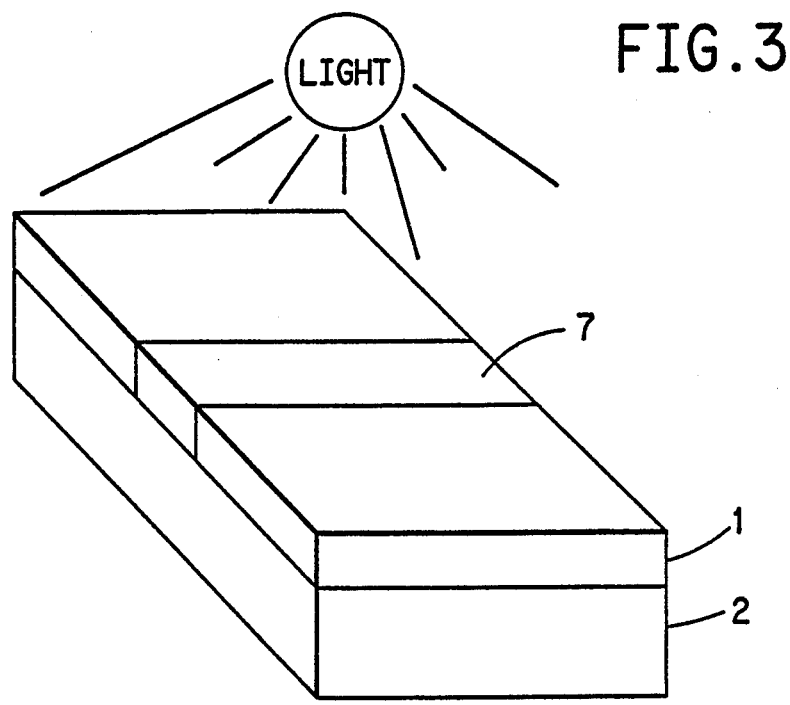
FIG. 3 depicts an optional step of flooding the film having a waveguide on a support with light.

FIG. 3 illustrates an optional step which follows the exposing step. The element resulting from the exposure step can be flooded with light, such as broadband ultraviolet light. This polymerizes some of at least one monomer in the film and typically most or all of one or all of the monomers in the film. This may allow for easy removal or attachment of the support 2. This resulting optical waveguide element can similarly be used in making optical waveguide devices, which devices are preferably used in the present invention.

Figure 4:
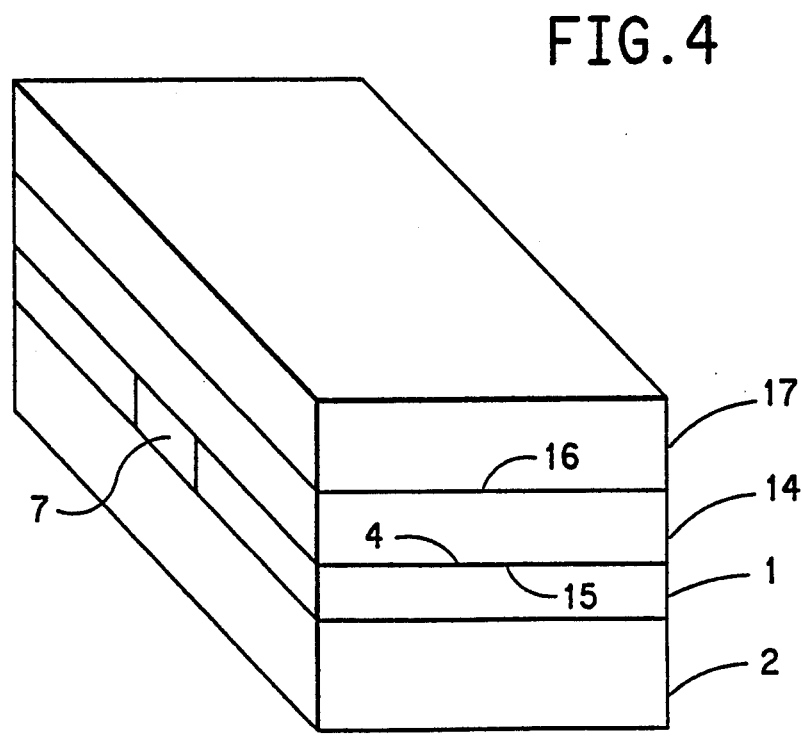
FIG. 4 shows a laminated structure comprising from top to bottom a support, a photohardenable layer, a film having a waveguide, and another support.

Next, referring to FIG. 4, a first substantially dry photohardenable layer 14 is laminated to the second film surface 4. The first layer 14 has first and second surfaces 15 and 16, respectively. The first layer 14 first surface 15 is laminated to the second film surface 4 by placing them in intimate contact and controllably applying pressure with rollers to remove air between the film 1 and layer 14. The first layer 14 is tacky. If the optional flooding step illustrated in FIG. 3 is not performed, then the film 1 is also tacky. Thus, the film 1 and first layer 14 easily adhere to one another. A support 17 is removably adhered to the second surface 16 of the first layer 14. FIG. 4 illustrates another optical waveguide element useful in making optical waveguide devices, which devices are preferably used in the present invention.

Figure 5:
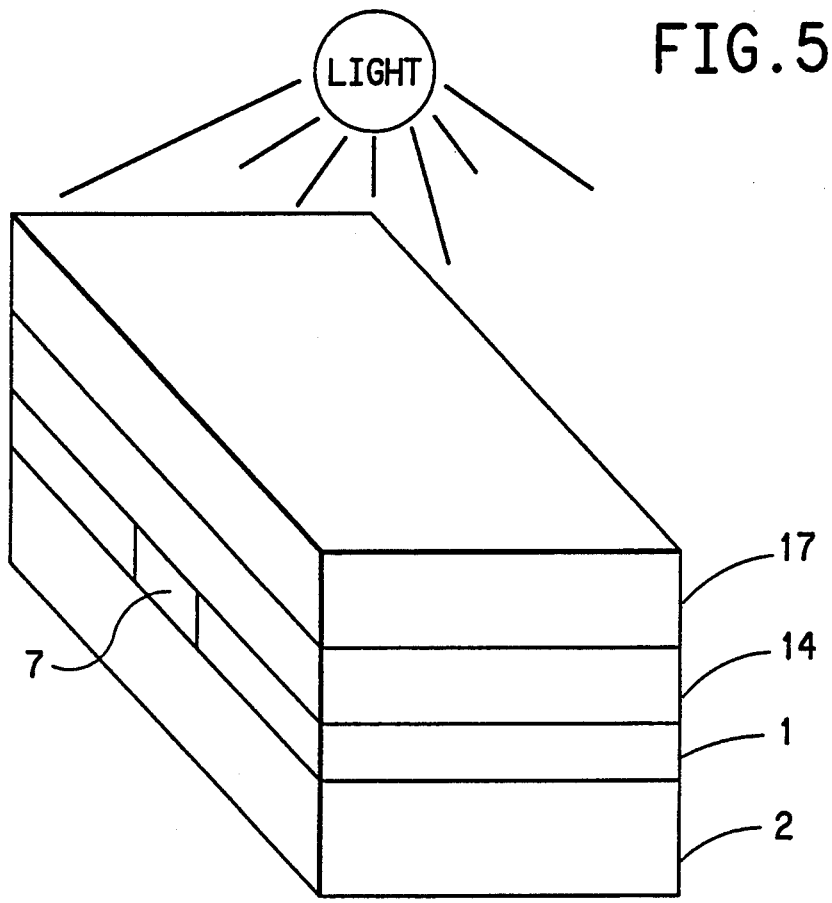
FIG. 5 illustrates an optional step of flooding the structure of FIG. 4 with light.

FIG. 5 shows an optional flooding step similar to that illustrated in FIG. 3, except the element being flooded is modified as described in relation to FIG. 4. The element resulting from the first lamination step can be flooded with light, such as broadband ultraviolet light. This polymerizes some of at least one monomer (and typically most or all of one or all of the monomers) in the first layer 14 and further polymerizes some of the at least one monomer in the film 1 (if not already polymerized by a previous flooding step). Extensive crosslinking or polymerization occurs between the monomer(s) of the layer 14 adjacent to the monomer(s) of the film 1 forming a diffuse boundary line or region. The resulting optical waveguide element is also useful in making an optical waveguide device in accordance with this invention.

Figure 6:
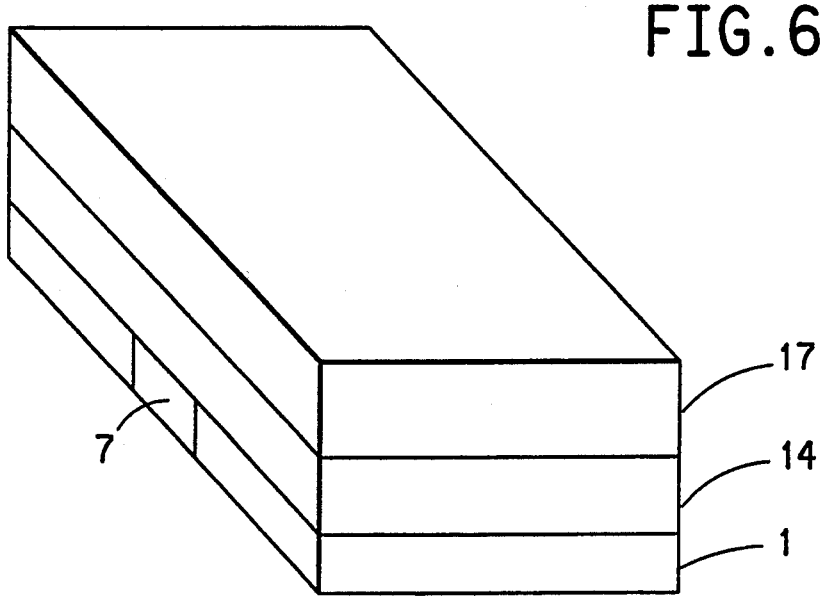
FIG. 6 is the structure of FIG. 4 or 5 with one of the supports removed.

FIG. 6 shows the element after the next step of removing the support 2 from the film 1 first surface 3.

Figure 7:
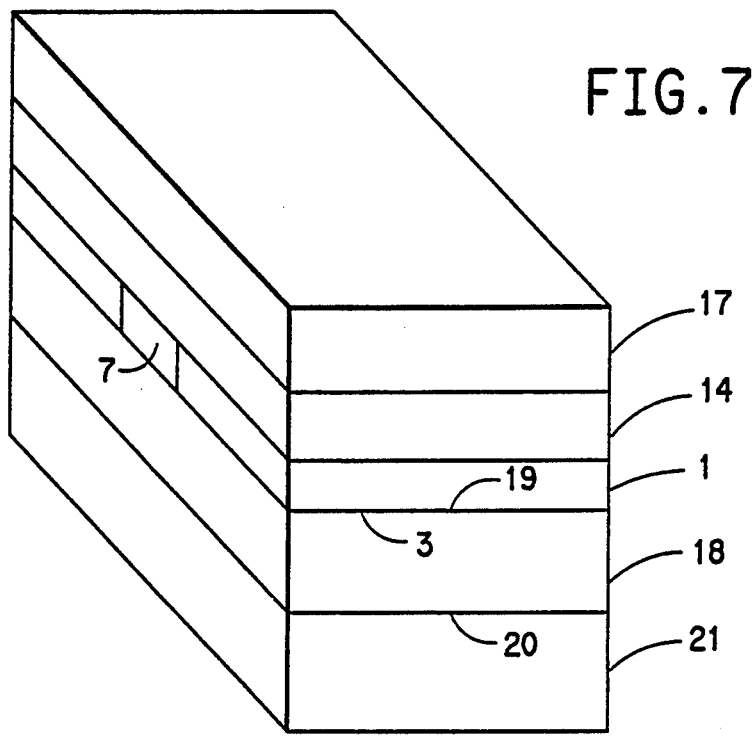
FIG. 7 is a perspective view of an optical waveguide device comprising from top to bottom a support, a photohardenable or photohardened layer, a film having a waveguide, a photohardenable layer, and a support.

Then, referring to FIG. 7, a second substantially dry photohardenable layer 18 is laminated to the film 1 first surface 3. The second layer 18 has first and second surfaces 19 and 20, respectively. The second layer 18 first surface 19 is laminated to the film first surface 3 by placing the in intimate contact and controllably applying pressure with rollers removing air between the film 1 and second layer 8. The second layer surfaces 19 and 20 are tacky and, thus, easily adhere to the film 1. A support 21 is removably adhered to the second layer second surface 20.

Figure 8:
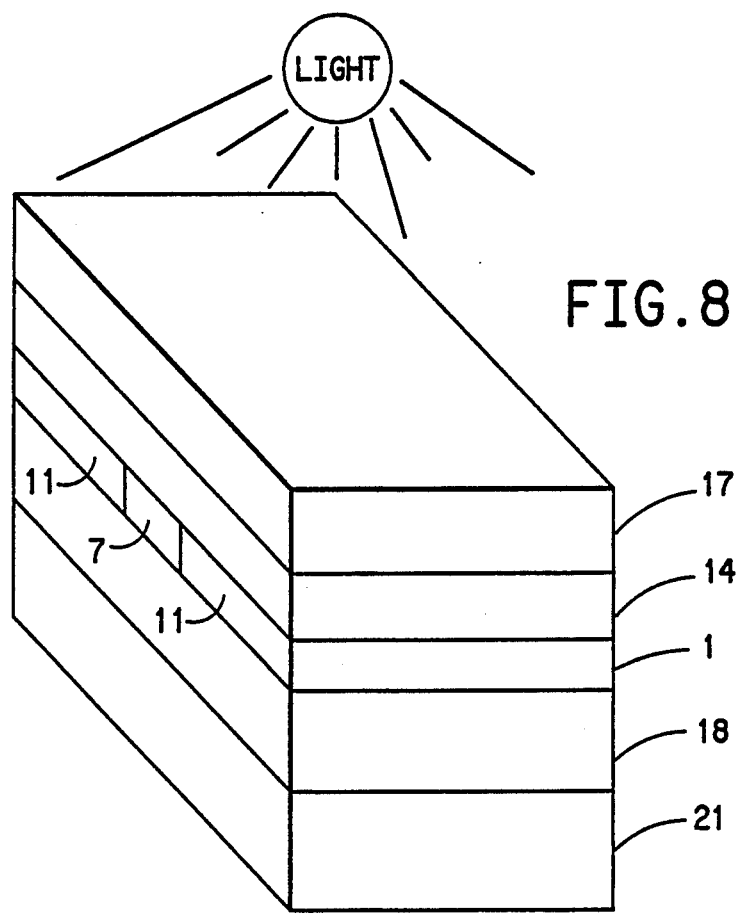
FIG. 8 shows the step of hardening the device of FIG. 7 by flooding it with light.

FIG. 8 illustrates a step of hardening the structure depicted in FIG. 7 by flooding it with light, such as broadband ultraviolet light. Throughout this application, the term "broadbend ultraviolet light" means light in the spectral region of about 350 through 400 nanometers. This step occurs for minutes, preferably 5, but can last longer. If this is the first flooding step, then this is the first polymerization of at least one monomer (and typically most or all of one or all monomers) in the remaining regions 11 in the film 1 and the first and second layers 14 and 18, respectively. It further polymerizes the at least one monomer in the region 7 of the film 1. If this is not the first flooding step, it polymerizes at least one monomer in the second layer and continues polymerizing the at least one monomer in the rest of the element. Some crosslinking or polymerization occurs between the previously polymerized film 1 and the monomer(s) in the second layer 18 forming a boundary line or region that is more evident than if the film 1 had not previously been flooded with light. Further, if this is not the first flooding step, for instance if buffer layer 14 was previously hardened by flooding it with light as illustrated in FIG. 5, then it would be preferred to harden the film 1 and the buffer layer 18 of the element illustrated in FIG. 8 by flooding light first through support 21, layer 18, film 1, layer 14, and then support 17. In other words, the structure should be flooded such that light passes through unhardened layers or films before previously hardened ones.

Furthermore, any one or all of the buffer layers and the film with a waveguide formed therein can be hardened by flooding them with light before the layers or film are laminated to the other parts. A device results having at least one buried channel waveguide in a laminated and photohardened matrix useful in integrated optical systems.

Figure 9:
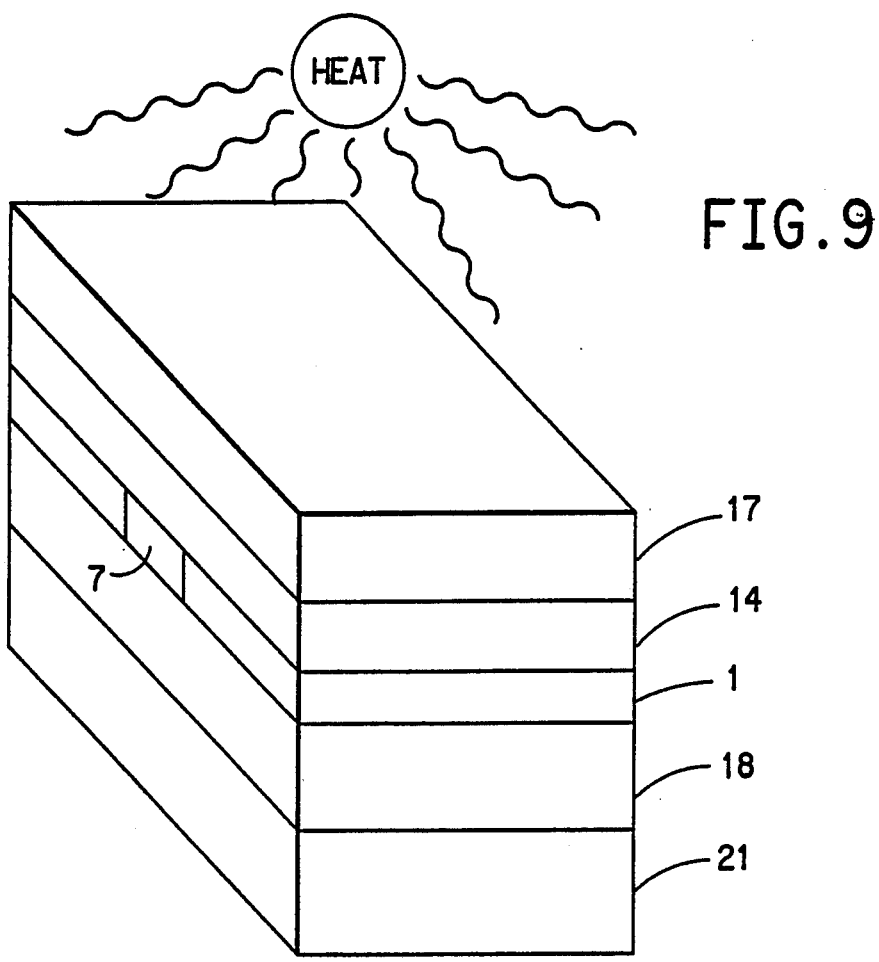
FIG. 9 shows the step of hardening the element of FIG. 7 or the device of FIG. 8 by heating it.

FIG. 9 illustrates another possible step of hardening the structure depicted in FIG. 7 by heating it. Actually, the layers and film can be heated before, in combination with, after, or in lieu of the light flooding step to harden of further harden the device. This heating step occurs at a temperature in the range of about 50° C. through 200° C. and preferably in the range of about 100° C. through 150° C. for a duration of minutes, preferably 5.

Photohardenable compositions are typically less sensitive to temperatures up to 100° C. than above 100° C. However, hardening may be initiated as low as 50° C. of held at the temperature for a sufficient period of time. As the temperature is increased beyond 100° C., thermally initiated hardening increases significantly.

After the hardening step, a maximum refractive index increase in the localized waveguide region as measured by an ASUJENA Interphako microscope occurs in the film in the range of 0.001 through 0.40 measured at 546 nanometers wavelength. The localized refractive index increase, n, may be derived by conventional shearing interference microscopy techniques and is calculated assuming a uniform index shift through the film such that n is effectively an average using the following equations:

$$f\lambda = \Delta nd$$

$$f = \frac{a}{b}$$

$$\frac{a\lambda}{b} = \Delta nd$$

where  $d$ = assumed waveguide thickness, typically the film thickness
$a$ = waveguide fringe shift
$b$ = fringe spacing
$\lambda$ = 0.546 μ, wavelength of light in the microscope This localized refractive index increase is contrasted and is not to be confused with a refractive index modulation measured from gratings prepared holographically, such as described in U.S. patent application Ser. No. 07/144,355 filed Jan. 15, 1988.

After the hardening step, the waveguide is transparent in the range of 0.6 through 1.6 micrometers wavelength. It is effectively transparent at 1.3 micrometers for single mode operation. Also after the hardening step, the maximum refractive index of the matrix except in and near the waveguide is in the range of 1.45 through 1.60 measured at 632 nanometers depending on formulation and/or extent of interlayer diffusion from adjoining layers or film of different indexes. The refractive index is determined by using an ABBE refractometer manufactured by Karl Zeiss.

Figure 10:
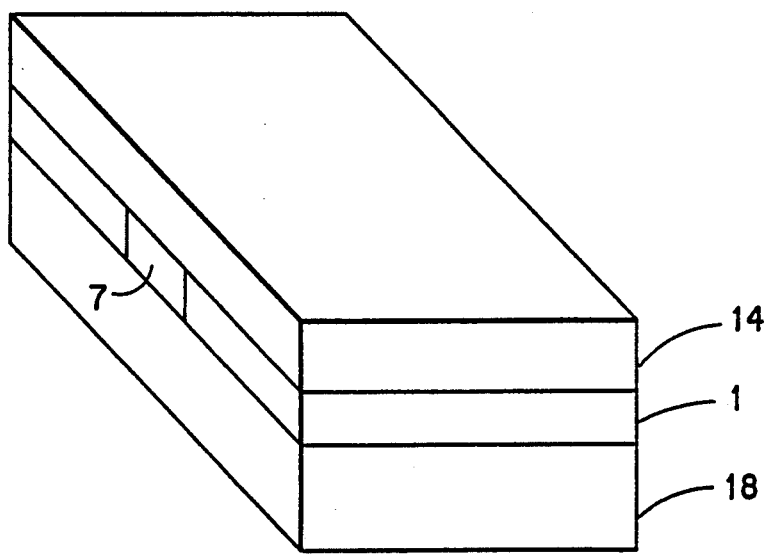
FIG. 10 is a perspective view of an optical waveguide device for use in integrated optical systems, the device comprising from top to bottom a first hardened layer, a hardened film having a waveguide, and a second hardened layer.

The supports 17 and 21 can be removed from the device resulting from the hardening step as shown in FIG. 10.

It has been found that a time delay of 5 to 120 minutes, preferably 20 to 30 minutes, after each flooding step and before removal of support sheets facilitate interlayer diffusion and polymerization.

Figure 11:
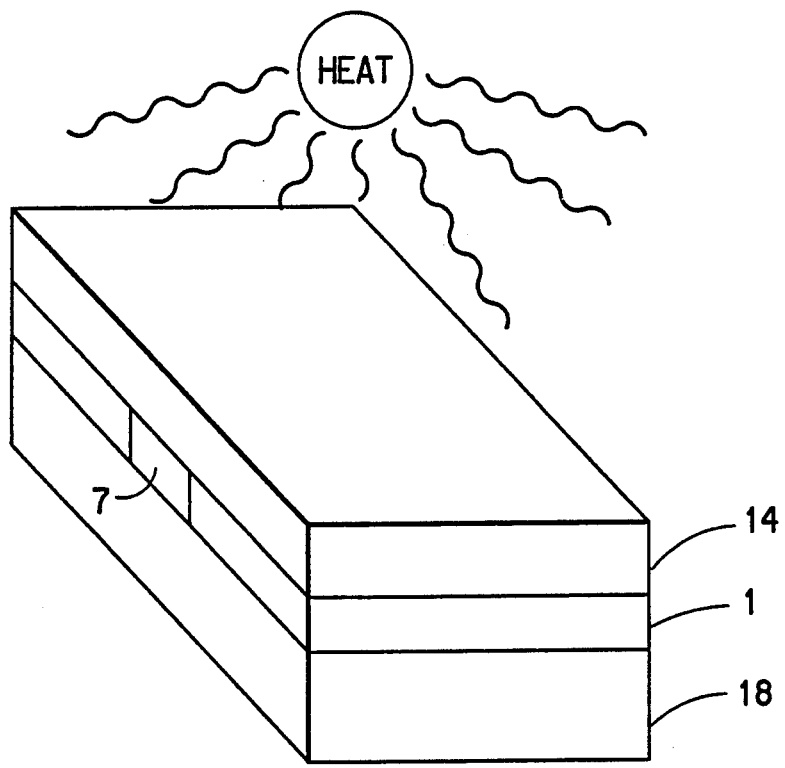
FIG. 11 shows the step of stabilizing the device of FIG. 10 by heating it.

FIG. 11 shows an optional, but preferred, step of stabilizing the device shown in FIG. 10 by heating it, typically after the hardening step. This heating step similarly occurs at a temperature in the range of about 50° C. thorough 200° C. and preferably in the range of about 100° C. through 150° C. However, this stabilizing step occurs longer than the hardening step. Preferably the stabilizing step occurs in the range of about 20 minutes through 2 hours and more preferably for about an hour. This heating makes the device more environmentally stable ensuring water and other elements in the environment will not interfere with proper operation of the device. Further, this heating provides thermal stabilization of optical and mechanical properties allowing operation of the resulting device over a wide range of temperatures without modification of the device properties.

In the device of FIG. 10 or 11, the first and second layers 14 and 18, respectively, have equal thicknesses since the films 14 and 18 are substantially identical, thus inherently fulfilling the "equidistance" requirement. It is preferable for the purposes of this invention to select and cut the pieces of films 14 and 18 from adjacent areas of the same roll of film, in order to ensure identical thickness.

One of the advantages of this arrangement is the ease of adding one or more substantially dry photohardenable or photohardened layers on each side with or without a waveguide or grating, and build up any desired thickness, still fulfilling the "equidistance" requirement.

All layers can be made out of the same material as the film. Then the hardened device matrix is substantially homogeneous in composition and refractive index except in and near the waveguide. Preferably, however, after the hardening step, the waveguide has a refractive index about 0.005 and 0.060 greater than the hardened film and about 0.001 to 0.025 greater than the hardened layers. Of course, regardless of whether different materials are used for different layers and the film, the composition and refractive index in each exposed region is substantially homogeneous in composition and refractive index.

Figure 12:
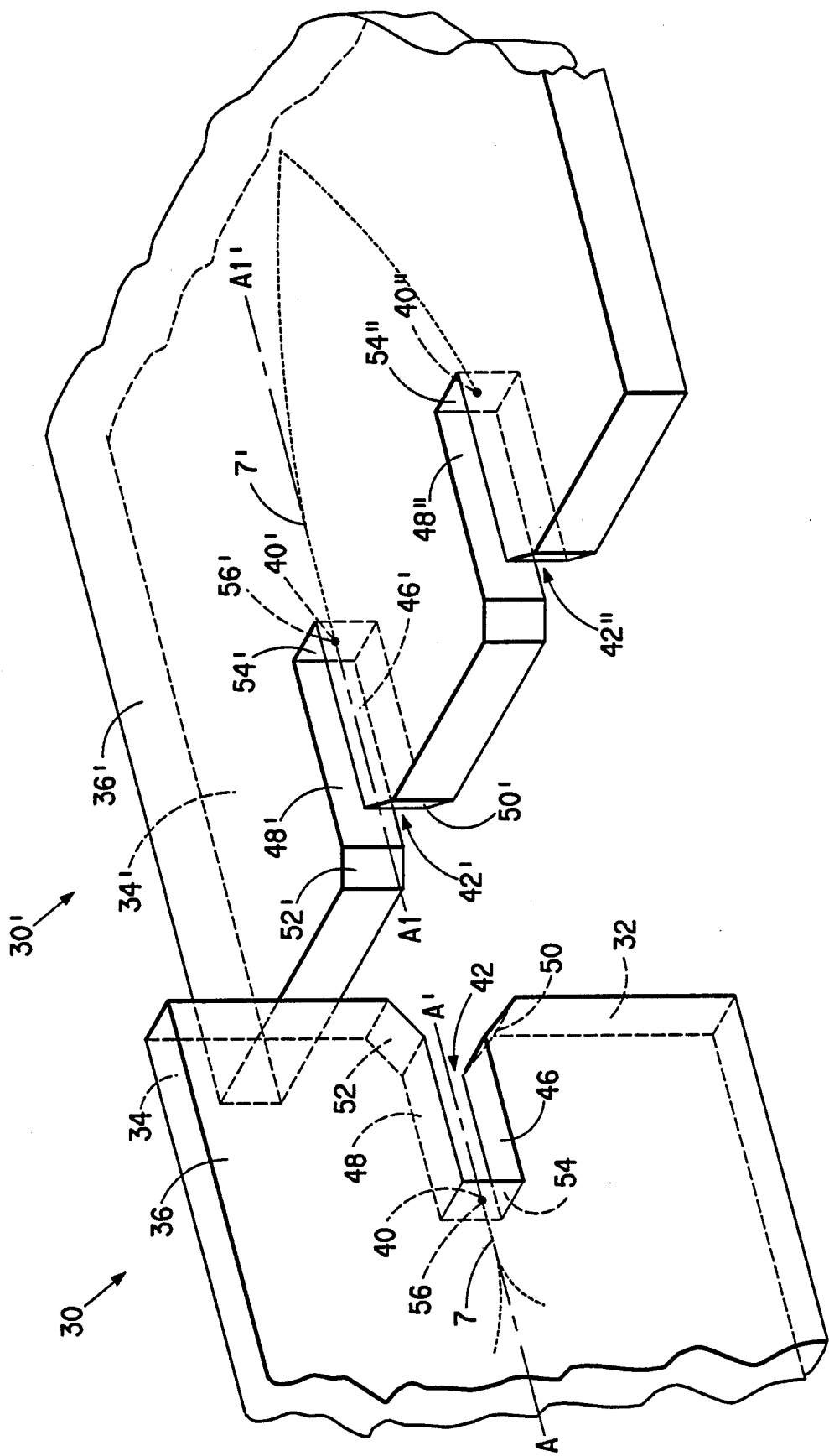
FIG. 12 is a perspective vie of two optical waveguide devices having through-slots before they have been connected.

FIG. 12 illustrates in a perspective view an optical waveguide devices 30 and a matching similar optical waveguide device 30', preferably both made according to the preceding discussion. The devices have similar configuration, and they are adaptable to be connected or coupled to each other. Device 30 has a terminal edge 32, and a first pair of opposite external surfaces 34 and 36, which are substantially parallel to each other, and they extend away from the terminal edge 32. There is provided also a waveguide 7, which should be positioned equidistantly between the first pair of opposite surfaces 35 and 36. The waveguide 7 has an end-point 40 and an optical or center axis A-A'. The center axis A-A' forms an angle with the terminal edge 32, which should have a value different than zero, and should preferably be a substantially right angle. The thickness of the optical device 30 is defined as the distance between the parallel and opposite surfaces 34 and 36.

The optical waveguide device 30 has also a through-slot 42 which extends in a general direction substantially parallel to the direction of the waveguide 7, which is the same as the direction of its center axis A-A'. As a matter of fact, the through-slot has a center axis (not shown) which coincides with the center axis A-A' of the waveguide 7. The through-slot 42 starts at the terminal edge 32, and it extends adequately within the device 30 as to meet the end point 40 of the waveguide 7. The slot 42 is confined by a second pair of opposite surfaces 46 and 48 which are in a general way substantially parallel to each other and to the center axis A-A' of the waveguide 7. It is required that the width of the through-slot, defined as the distance separating the opposite surfaces 46 and 48, may not be excessively smaller than the thickness of the matching device 30'. By this it is meant that the width of the slot must not be so much smaller than the thickness of the matching device 30' as to produce deleterious effects when it is inserted into a respective slot 42' of device 30'. Such deleterious effects may be breakage, cracking, excessive stress, misalignment, and the like, occurring to one or both devices. Although the width of the through-slot 42 may be larger than the thickness of the matching device 30', the primary advantage of this invention of automatically achieving outstanding alignment will be minimized. Thus, it is preferable that the width of the slot 42 equals the thickness of the matching device. It is more preferable that the thickness of the through-slot 42 is adequately smaller, in a trapezoidal manner, than the thickness of the matching device 30', so that when the optical waveguide device 30 is connected to the matching device 30' through coupling of their respective through-slots 42 and 42', a tight and secure fit is created. By "trapezoidal manner" it is meant that the through-slot 42 is slightly less wide in the region disposed towards the terminal edge 32 as compared to the region disposed toward the inside of the device 30. Two lips 50 and 52 may be provided for facilitating the insertion of one device into the other at their respective slots 42 and 42'. The lips may have rounded edges for easier insertion of one slot into another.

The through-slot 42 is also confined by an internal surface 54, which meets with and is perpendicular to both the first pair of surfaces 34 and 36, and to the second pair of surfaces 46 and 48. The internal surface 54 has a center point 56, which coincides with the end 40 of the waveguide 42.

In this manner, when the through-slot 42 of the optical waveguide device 30 is coupled with a similar slot 42' of the matching similar device 30', the ends 40 and 40' of the respective waveguides 7 and 7' come in contact, and the center or optical axes of the waveguides substantially coincide.

Figure 13:
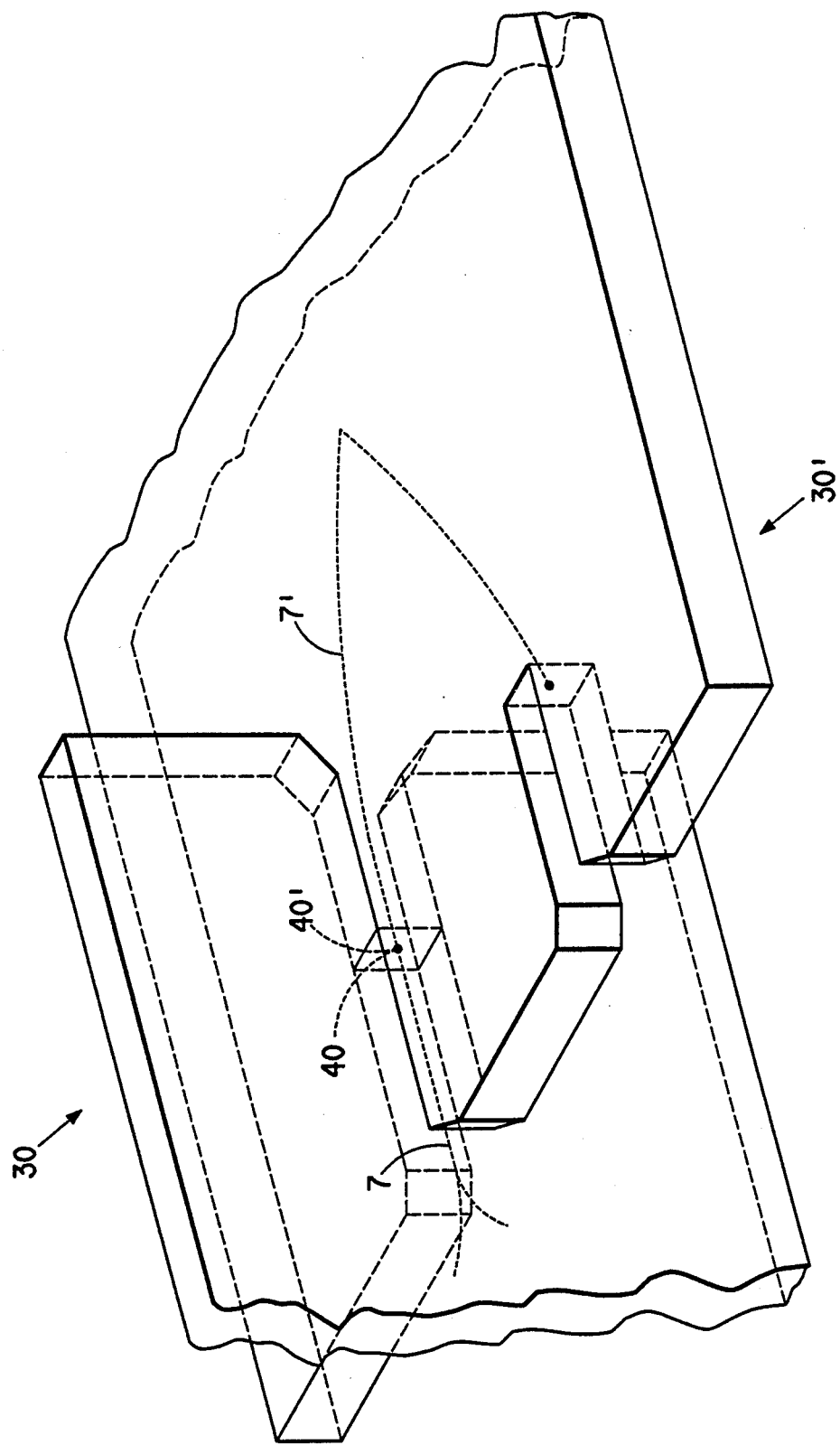
FIG. 13 is a perspective view of the two optical waveguide devices shown in FIG. 12 after they have been connected over their through-slots.

FIG. 13 shows the manner in which two devices are positioned, when the slot one of them 30, has been inserted completely into the slot of another similar device 30' so that the corresponding ends 40 and 40' of their respective waveguides 7 and 7' come in contact with each other.

Since simple mechanical contact may leave spots of the waveguide ends, which spots may still remain apart from each other, it is highly preferable that a liquid is placed between the ends of the waveguides to fill such spots. This liquid should have a refractive index as close as possible to the refractive index of the waveguides. It is preferable that this liquid possesses adhesive characteristics in order to secure the two respective devices in place. It is even more preferable that the curing of the adhesive liquid is a photohardenable one, and thus is cured by a photohardening mechanism. This is preferred not only because most of the steps of making the devices of the instant invention involve actinic radiation, but also and most importantly because by selecting similar or in general appropriate monomers or oligomers, initiators, and other adjuncts, in appropriate amounts, one may approximate and match the desirable refractive index with higher accuracy and broader formulation and condition latitude. The technique of using such adhesive formulations may be applied not only for the devices of the present invention, but also in any other case, where the free ends of two embedded waveguides come in contact for the purposes of coupling, including connectors, couplers, splitters, fiber embedded waveguides, and the like, as well as combinations thereof.

Monomers, oligomers, polymers, initiators, chain transfer agents and other constituents like the ones used for the fabrication of the devices described herein may also be used for making the optically matching liquid, which preferably is also an adhesive when photohardened. Of course, any other materials may be used as long as the requirement of matching as close as possible the refractive index of the waveguides under consideration is met.

It is preferable that the through-slot is ablated by the use of a laser, and more preferably by an excimer laser. A method for providing excimer ablated fiber channels for passive (without need of alignment equipment) coupling involves a computer controlled image processing and positioning system. The excimer laser is masked by a rectangular aperture and is projected onto the optical waveguide device though a 15× reduction lens.

The rectangular aperture's width is adjusted until the correct channel width for passive coupling is achieved. For preferred present applications, this width is ~112 $\mu$m wide (as measured by the computer) at the optical waveguide device plane. A "sample" channel is created away from the work area. This sample channel is digitized and analyzed for width; the center and angular orientation is determined by the image processing system, then this image is stored as the reference that will be used to align all of the waveguides. At this point a waveguide is brought into the field of view and the optical waveguide device is aligned laterally and rotationally, iteratively, until within tolerance of the reference channel alignment (+/−0.5 $\mu$m laterally, +/−0.25 degrees rotationally). Then the actual channel to this waveguide is ablated; fluence ~2.5 J/cm$^2$, repetition rate 10 Hz, 30 sec. This procedure is repeated using the stored reference fiber channel image on the rest of the waveguides to be processed.

The photohardenable base and buffer layers used herein are thermoplastic compositions which upon exposure to actinic radiation from crosslinks or polymers of high molecular weight to change the refractive index and rheological character of the composition(s). Preferred photohardenable materials are photopolymerizable compositions, such as disclosed in U.S. Pat. No. 3,658,526 (Haugh) and more preferred materials are described copending application Ser. Nos. 07/144,355 (U.S. Pat. No. 4,942,112), 07/144,281 (abandoned) and 07/144,840 (abandoned), all filed Jan. 15, 1988 and all assigned to E. I. du Pont de Nemours and Company, Incorporated. In these materials, free radical addition polymerization and crosslinking of a compound containing one or more ethylenically unsaturated groups, usually in a terminal position, hardens and insolubilizes the composition. The sensitivity of the photopolymerizable composition is enhanced by the photoinitiating system which may contain a component which sensitizes the composition to predetermined radiation sources, e.g., visible light. Conventionally a binder is the most significant component of a substantially dry photopolymerizable base or layer in terms of what physical properties the base or layer will have while being used in the invention. The binder serves as a containing medium for the monomer and photoinitiator prior to exposure, provides the base line refractive index, and after exposure contributes to the physical and refractive index characteristics needed for the base layer of buffer layer. Cohesion, adhesion, flexibility, diffusibility, tensile strength, in addition to index of refraction are some of the many properties which determine if the binder is suitable for use in the base layer or the buffer layer.

Dry base or layer photohardenable elements contemplate to be equivalent are photodimerizable or photocrosslinkable compositions such as disclosed in U.S. Pat. No. 3,526,504 (Celeste) or those compositions in which hardening is achieved by a mechanism other than the free radical initiated type identified above.

While the photopolymerizable base or layer is a solid sheet of uniform thickness it is composed of three major components, a solid solvent soluble performed polymeric material, at least one liquid ethylenically unsaturated monomer capable of addition polymerization to produce a polymeric material with a refractive index substantially different from that of the performed polymeric material, or binder, and a photoinitiator system activatable by actinic radiation. Although the base or layer is a solid composition, components interdiffuse before, during and after imaging exposure until they are fixed or destroyed by a final uniform treatment usually by a further uniform exposure to actinic radiation. Interdiffusion may be further promoted by incorporation into the composition of an otherwise inactive plasticizer.

In addition to the liquid monomer, the composition may contain solid monomer components capable of interdiffusing in the solid composition and reacting with the liquid monomer to form a copolymer with a refractive index shifted from that of the binder.

In the preferred compositions for use as the base layer or buffer layers in this invention, the preformed polymeric material and the liquid monomer are selected so that either the preformed polymeric material or the monomer contains one or more moieties taken from the group consisting essentially of substituted or unsubstituted phenyl, phenoxy, naphthyl, naphthyloxy, heteroaromatic groups containing one to three aromatic rings, chlorine, and bromine and wherein the remaining component is substantially free of the specified moieties. In the instance when the monomer contains these moieties, the photopolymerizable system hereinafter is identified as a "Monomer Oriented System" and when the polymeric material contains these moieties, the photopolymerizable system hereinafter is identified as a "Binder Oriented System".

The stable, solid, photopolymerizable compositions preferred for this invention will be more fully described by reference to the "Monomer Oriented System" and "Binder Oriented System." The Monomer Oriented System is preferred for the base layer.

The monomer of the Monomer Oriented System is a liquid, ethylenically unsaturated compound capable of addition polymerization and having a boiling point above 100° C. The monomer contains either a phenyl, phenoxy, naphthyl, naphthoxy, heteroaromatic group containing one to three aromatic rings, chlorine or bromine. The monomer contains at least one such moiety and may contain two or more of the same or different moieties of the group, provided the monomer remains liquid. Contemplated as equivalent to the groups are substituted groups where the substitution may be lower alkyl, alkoxy, hydroxy, carboxy, carbonyl, amino, amido, imido or combinations thereof provided the monomer remains liquid and diffusible in the photopolymerizable layer.

Preferred liquid monomers for use in the Monomer Oriented System of this invention are 2-phenoxyethyl acrylate, 2-phenoxyethyl methacrylate, phenol ethoxylate acrylate, 1-(p-chlorophenoxy) ethyl, p-chlorophenyl acrylate, phenyl acrylate, 1-phenylethyl acrylate, di(2-acryloxyethyl) ether of bisphenol-A, and 2-(2-naphthyloxy) ethyl acrylate.

While monomers useful in this invention are liquids, they may be used in admixture with a second solid monomer of the same type, e.g., N-vinyl-carbazole, ethylenically unsaturated carbazole monomers such as disclosed in *Journal of Polymer Science: Polymer Chemistry Edition*, Vol. 18, pp. 9–18 (1979) by H. Kamagawa et al., 2-naphthyl acrylate, pentachlorophenyl acrylate, 2,4,6-tribromophenyl acrylate, and bisphenol A diacrylate, 2-(2-naphthyloxy) ethyl acrylate, and N-phenyl maleimide.

The solvent soluble polymeric material or binder of the Monomer Oriented System is substantially free of phenyl, phenoxy, naphthyl, naphthyloxy, heteroaromatic group containing one to three aromatic rings, chlorine and bromine.

Preferred binders for use in the Monomer Oriented system of this invention are cellulose acetate butyrate polymers; acrylic polymers and inter polymers including polymethyl methacrylate, methyl methacrylate/methacrylic acid and methylmethacrylate/acrylate acid copolymers, terpolymers of methylmethacrylate/C$_2$–C$_4$ alkyl acrylate or methacrylate/acrylic or methacrylic acid; polyvinylacetate; polyvinyl acetal, polyvinyl butyral, polyvinyl ormal; and as well as mixtures thereof.

The monomers of the Binder Oriented System is a liquid ethylenically unsaturated compound capable of addition polymerization and having a boiling point above 100° C. The monomer is substantially free of moieties taken from the group consisting essentially of phenyl, phenoxy, naphthyl, naphthyloxy, heteroaromatic group containing one to three aromatic rings, chlorine and bromine.

Preferred liquid monomers for use in Binder Oriented Systems of this invention include decanediol diacrylate, iso-bornyl acrylate, triethylene glycol diacrylate, diethyleneglycol diacrylate, triethylene glycol dimethacrylate, ethoxyethoxyethyl acrylate, triacrylate ester of ethoxylated trimethylolpropane, and 1-vinyl-2-pyrrolidinone.

While monomers used in Binder Oriented Systems are liquids, they may be used in admixture with a second solid monomer of the same type, e.g., N-vinylcaprolactam.

The solvent soluble polymeric material or binder of the Binder Oriented system contains in its polymeric structure moieties taken from the group consisting essentially of phenyl, phenoxy, naphthyl naphthyloxy or heteroaromatic group containing one to three aromatic rings as well as chloro or bromo atoms. Contemplated as equivalent to the groups are substituted groups where the substitution may be lower alkyl, alkoxy, hydroxy, carboxy, carbonyl, amido, imido or combinations thereof provided the binder remains solvent soluble and thermoplastic. The moieties may form part of the monomeric units which constitute the polymeric binder or may be grated onto a pre-prepared polymer or interpolymer. The binder of this type may be a homopolymer or it may be an interpolymer of two or more separate monomeric units wherein at least one of the monomeric units contains one of the moieties identified above.

Preferred binders for use in the Binder Oriented System include polystyrene, poly (styrene/acrylonitrile), poly(styrene/methyl methacrylate), and polyvinyl benzal as well as admixtures thereof.

The same photoinitiator system activatable by actinic radiation may be used in either the Monomer Oriented System or the Binder Oriented System. Typically the photoinitiator system will contain a photoinitiator and may contain a sensitizer which extends the spectral response into the near U.V. region and the visible spectral regions.

Preferred photoinitiators include CDM-HABI, i.e., 2-(o-chlorophenyl)-4,5-bis(m-methoxyphenyl)-imidazole dimer; o-C1-HABI, i.e., 1,1'-biimidazole, 2,2'-bis-(o-chlorophenyl)-4,4',5,5'-tetraphenyl-; and TCTM-HABI, i.e., 1H-imidazole, 2,5-bis(o-chlorophenyl)-4-3,4-dimethoxyphenyl-, dimer each of which is typically used with a hydrogen donor, e.g., 2-mercaptobenzoxazole.

Preferred sensitizers include the following:
DBC, i.e., Cyclopentanone, 2,5-bis-(diethylamino)-2-methylphenyl)methylene);
DEAW, i.e., Cyclopentanone, 2,5-bis-((4-(diethylamino)-phenyl)methylene); and Dimethoxy-JDI, i.e., 1H-inden-1-one, 2,3-dihydro-5,6-dimethoxy-2-((2,3,6,7-tetrahydro-1H,5H-benzo[i,j-]quinolizine-9-yl)-methylene)-.

The solid photopolymerizable compositions of this invention may contain a plasticizer. Plasticizers of this invention may be used in amounts varying from about 2% to about 20% by weight of the compositions preferably 5 to 15 wt. %.

Preferred plasticizers for use in simple cellulose acetate butyrate systems are triethyleneglycol dicaprylate, tetraethyleneglycol diheptanoate, diethyl adipate, Brij 30 and tris-(2-ethylhexyl)phosphate. Similarly, triethyleneglyco dicaprylate, diethyl adipate, Brij 30, and tris(2-ethylhexyl)-phosphate are preferred in "Monomer Oriented Systems" where cellulose acetate butyrate is the binder.

Other components in addition to those described above can be present in the photopolymerizable compositions in varying amounts. Such components include: ultraviolet radiation absorbing material, thermal stabilizers, hydrogen donors, oxygen scavengers and release agents.

Amounts of ingredients in the photopolymerizable compositions will generally be within the following percentage ranges based on total weight of the photopolymerizable layer: monomer, 5–50%, preferably 15–35%; initiator 0.1–10%, preferably 1–5%; binder, 25–75%, preferably 45–65%; plasticizer, 0–25%, preferably 5–15%; other ingredients 0–5%, preferably 1–4%.

The supports can be any substance transparent to actinic radiation that provides sufficient support to handle the combined base and layer. Preferably the support is transparent to light in the spectral region of 0.6 through 1.6 micrometers wavelengths. The term "support" is meant to include natural or synthetic supports, preferably one which is capable of existing in a flexible or rigid film or sheet form. For example, the support or substrate could be a sheet or film of synthetic organic resin, or a composite of two or more materials. Specific substrates include polyethylene terephthalate film, e.g., resin-subbed polyethylene terephthalate film, flame or electrostatic discharge treated polyethylene terephthalate film, glass, cellulose acetate film, and the like. The thickness of the supports has no particular importance so long as it adequately supports the film or layer removably adhered to it. A support thickness of about twenty-five (25) to fifty (50) micrometers using polyethylene terephthalate provides sufficient rigidity.

The following examples are provided as an illustration of how such a device may be made, but does not limit, the invention.

EXAMPLE 1

A substantially dry photohardenable (active) film (base or waveguide layer) of about 5.3 nm thick, having the ingredients listed in Table I, coated on a 25 nm thick clear polyethylene terephthalate support, in approximately a 3 inch×4 inch section, is exposed to broad band ultraviolet light in the spectral range of 350 to 400 nm through a conventional chrome-plated glass photomask to produce 1×4 (one waveguide end to four waveguide ends or four to one) coupler waveguide pattern. After exposure and then an appropriate delay time of about 15 minutes, the mask is removed.

Next, a first substantially dry photohardenable layer (inner buffer layer) of about 30 nm thick, having the ingredients listed in Table II, coated on a 25 nm thick clear polyethylene terephthalate support, is laminated to the film surface over the waveguide, and is subsequently flooded with broadband ultraviolet light in the spectral range on 350 to 400 nanometers. The film support is then removed by mechanical stripping.

Next, a second photohardenable layer (inner buffer layer) of identical composition and structure, as the first buffer layer, with support, is laminated to the opposite surface of the film (base or waveguide layer) and flooded as above.

In subsequent steps, the supports attached to the buffer layers are removed. Sequentially, a third and fourth buffer layer (outer buffer layers) of a composition as shown in Table III, and a structure as the other buffer layers are laminated to the first and second buffer layers, respectively, with flooding between each lamination and subsequent removal of the buffer layer support to form an optical waveguide device having a buried channel waveguide.

The resultant device is heated at 100° C. for 60 minutes to achieve thermal stability.

TABLE I

| BASE OR WAVEGUIDE LAYER | |
| --- | --- |
| INGREDIENT | WEIGHT % |
| Cellulose acetate butyrate[1] | 56.54 |
| Phenoxyethyl acrylate | 35.00 |
| Triethyleneglycol dicaprylate | 5.00 |
| o-Cl HABI[1] | 1.00 |
| 2-Mercaptobenzoxazole | 1.89 |
| Sensitizing dye (DEAW)[3] | 0.56 |
| 2,6-Di-t-butyl-4-methylphenol | |

[1]Eastman type CAB 531-1
[2]1,1'-bis-biimidazole, 2,2'-bis-o-chlorophenyl-4,4',5,5'-tetraphenyl; CAS 1707-68-2
[3]2,5-bis([4-diethylamino)-phenyl]methylene)cyclopentanone

TABLE II

| INNER BUFFER LAYER | |
| --- | --- |
| INGREDIENT | WEIGHT % |
| Poly(vinylacetate), MW 500,000, CAS 9003-20-7 | 66.04 |
| Phenol ethoxylate monoacrylate, CAS 56641-05-5 | 17.02 |
| Ethoxylated bisphenol A diacrylate, CAS 24447-78-7 | 3.00 |
| N-Vinyl carbazole | 7.94 |
| o-Cl-HABI[1] | 3.69 |
| 4-Methyl-rH-1,2,4-triazole-3-thiol, CAS 24854-43-1 | 2.09 |
| FC-430[2] | 0.19 |
| Sensitizing dye (DEAW)[3] | — |

[1]1,1'-bis-biimidazole, 2,2'-bis-o-chlorophenyl-4,4',5,5'-tetraphenyl; CAS 1707-68-2
[2]fluoroaliphatic polymeric esters, 3M Company, St. Paul, MN
[3]2,5-bis([4-(diethylamino)-phenyl]methylene)cyclopentanone

TABLE III

| OUTER BUFFER LAYER | |
| --- | --- |
| INGREDIENT | WEIGHT % |
| Cellulose acetate butyrate[1] | 57.11 |
| Phenoxyethyl acrylate | 38.00 |
| o-Cl HABI[2] | 3.00 |
| 2-Mercaptobenzoxazole | 1.89 |

[1]Eastman type CAB 531-1
[2]1,1'-bis-biimidazole, 2,2'-bis-o-chlorophenyl-4,4',5,5'-tetraphenyl: CAS 1707-68-2

EXAMPLE 2

An optical waveguide device of the category described in Example 1 was made by using the materials shown in Tables IV, V, and VI.

The total thickness of the device was approximately 123 microns +/−1 micron, with an embedded straight single-mode waveguide having dimensions 7.5 microns +/−0.2 micron in both waveguide layer thickness and waveguide width. The guide operated single mode at 1300 nm with a typical loss of 0.4 to 0.5 dB/cm.

Two ablated slots were created at each side of the device, using an excimer laser with optical feedback control for positioning. The positions of the slots were such so that their center axes coincided with the center or optical axes of the respective waveguides. The created slots were approximately 121 +/−1 micron wide, with a slight trapezoidal profile of the order of 5 degrees sloped sides of the slot. The excimer laser wavelength was 248 nm. Using approximately 360 millijoules per pulse and a 10-hertz rep rate, it took 30 seconds to create the individual slot. A key point is that the ablated slot was slightly smaller by a few microns than the material thickness, so that the two inserted slots could snugly fit onto the material of the adjoining piece.

Figure 14:
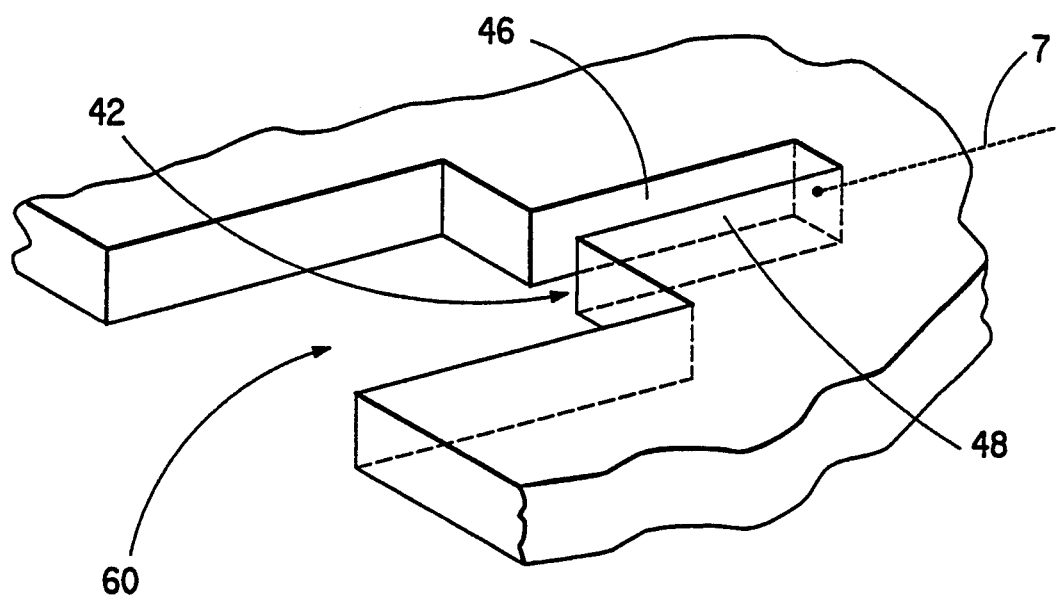
FIG. 14 shows a cross-sectional view of a slot including an enlarged outer region.

The length of each slot was approximately 470 microns. An enlarged outer region 60 was also created, as shown in FIG. 14, having a length of approximately 470 microns. The outer region 60, with a width of approximately 375 microns, was used for general alignment and aid in microtoming the terminal edge without distorting the narrow slot region. Typically, one could have outer regions having lengths of 300 to 1000 microns for insertion to create the slot couple. In this particular case, the length of 470 microns was completely satisfactory. However, it should be noted that although in this example, use of outer regions 60 was made, the most preferred configuration is the one shown in FIGS. 12 and 13, wherein the outer region 60 is replaced by the pair of beveled edges 50 and 52. The beveled configuration facilitates insertion of one slot to another. In addition rounding of the beveled edges is also preferred.

In this example, the device made above with two ablated slots at each end, was first cut in half and the slots were inserted into each other, with the plane of the two sections 90 degrees from each other.

The slots were easily inserted by hand, creating an accurate alignment of the two single-mode waveguides for each of the two sections. Optical loss was evaluated by using a butt-coupled fiber to the outside edge of one of the sections and looking at the near-field output using an IR camera focused on the output edge of the output section.

When initially placed together with no refracting index matching, the total insertion loss was approximately 2.5 dB, but once the optically matching adhesive having the formulation shown in Table VII was placed into the slot-coupled region and totally polymerized, the loss was 1.4 dB total insertion. This includes the estimated 0.9 to 1.1 dB linear guide loss for the 2.23 cm long guide from input to output through both sections. Typical butt-coupled loss is of the order 0.4 +/−0.1 dB and thus the expected loss of the system was 1.2 minimum to 1.6 maximum, or typically 1.4. Since the absolute insertion loss measurement was 1.4 dB, we conclude that the slot couple additional loss was close to 0 and at maximum 0.2 dB.

The optically matching adhesive, which was inserted into the slot through capillary action, covered all intersection surfaces, and it was polymerized using Teck Lite UV source for approximately 5 minutes. The two intersecting sections were then placed in a nitrogen atmosphere and exposed for 14 hours under fluorescent lights to ensure complete polymerization of the liquid optically matching adhesive, which gave a permanently bonded waveguide-to-waveguide couple.

For the following tables, the following definitions apply:

| | |
|---|---|
| o-Cl-HABI | 1,1'-biimidazole, 2,2'-bis[o-chlorophenyl]-4,4',5,5'-tetraphenyl-; CAS 1707-68-2 |
| MMT | 4-methyl-4H-1,2,4-triazole-3-thiol; CAS 24854-43-1 |
| Photomer ® 4039 | phenol ethoxylate monoacrylate; CAS 56641-05-5; Henkel Process Chemical Company |
| Sartomer 349 | ethoxylated bisphenol A diacrylate; CAS 24447-78-7; Sartomer Company, West Chester, PA |
| CAB | cellulose acetate butyrate |
| DEAW | 2,5-bis([4-diethylamino)-phenyl]methylene)cyclopentanone |
| TDMA | Triethylene glycoldimethacrylate |
| BHT | Butylated hydroxy toluene |
| Irgacure ® 651 | 2,2-dimethoxy-2-phenylacetophenone |
| Polyox ® WSR-3000 | Surfactant (Union Carbide Corp.) |
| Petrarch M8550 | Methacryloxypropyl trimethoxy silane |

TABLE IV

Waveguide Layer

| | % by wt. |
|---|---|
| Polyox WSRN-3000 | 1.00 |
| CAB 531-1 | 55.41 |
| Photomer 4039 | 34.94 |
| Sartomer 349 | 4.99 |
| MMT | 1.90 |
| o-Cl-HABI | 1.00 |
| DEAW | 0.55 |
| BHT | 0.01 |
| 3M FC-430 | 0.20 |

TABLE V

Inner Buffer Layer

| | % by wt. |
|---|---|
| Polyox WSRN-3000 | 45.00 |
| CAB 531-1 | 55.92 |
| Photomer 4039 | 23.45 |
| Sartomer 349 | 10.20 |
| o-Cl-HABI | 0.97 |
| Ethyl Michler's Ketone | 0.49 |
| Benzophenone | 2.91 |
| TDMA | 5.10 |

TABLE VI

Outer Buffer Layer

| | % by wt. |
|---|---|
| CAB 381-20 | 47.50 |
| Photomer 4039 | 20.00 |
| Sartomer 349 | 8.50 |
| TDMA | 21.00 |
| Irgacure 651 | 3.00 |

TABLE VII

Optically Matching Adhesive

| | % by wt. |
|---|---|
| TDMA | 73.5 |
| Photomer 4039 | 12.5 |
| Irgacure 651 | 2 |
| Petrarch M 8550 | 12 |

Examples demonstrating the operation of the instant invention have been given for illustration purposes only, and should not be construed as restricting the scope or limits of this invention in any way other than is recited in the appended claims.

What is claimed is:

1. An optical waveguide device adaptable to be connected to a matching similar optical waveguide device, comprising:

a pair of opposite surfaces;

an enclosed waveguide having a center-axis, an end point and a guiding direction, the waveguide being positioned equidistantly between the opposite surfaces;

a through-slot extending in a direction substantially parallel to the direction of the waveguide, so that when the through-slot of the optical waveguide device is coupled with a similar slot of a second similar device, the end-points of the respective waveguides come in contact, and the center-axes of the waveguides substantially coincide.

2. An optical waveguide device as defined in claim 1, wherein the width of the through-slot is substantially equal to the thickness of the matching device.

3. An optical waveguide device as defined in claim 1, wherein the width of the through-slot is adequately smaller in a trapezoidal manner than the thickness of the matching device, so that when the optical waveguide device is connected to the matching device through coupling of their respective through-slots, a tight and secure fit is created.

4. An optical waveguide device as defined in claim 3, coupled with the matching similar device through an adhesive photopolymer composition.

5. An optical waveguide device as defined in claim 1, coupled with a second similar device through an adhesive photopolymer composition.

6. An optical waveguide device as defined in claim 1, comprising a laminate of a middle photopolymer layer containing the waveguide, and two external photopolymer layers having the same thickness.

7. An optical waveguide device as defined in claim 6, coupled with the matching similar device through an adhesive photopolymer composition.

8. An optical waveguide device adaptable to be connected to a matching similar optical waveguide device, comprising:

a terminal edge;

a first pair of opposite external surfaces, substantially parallel to each other, and extending away from the terminal edge; and a waveguide positioned equidistantly between the first pair of the opposite external surfaces, and having an end point and a center axis, the center axis forming an angle greater than zero with the terminal edge;

the device also having a through-slot extending in a direction substantially parallel to the guiding direction of the waveguide, the through-slot starting at the terminal edge and extending within the device so as to meet the end of the waveguide, the through-slot having a center axis coinciding with the center axis of the waveguide, the through-slot confined by a second pair of opposite side surfaces, substantially parallel to each other and to the center axis of the waveguide, and substantially perpendicular to the first pair of surfaces with the requirement that the width of the through-slot is substantially the same as the thickness of the matching device, and an internal surface meeting with and being substantially perpendicular to the first and the second pairs of surfaces, the internal surface having a center point, the center point coinciding with the end of the waveguide, so that when the through-slot of the optical waveguide device is coupled with a similar slot of a second similar device, the ends of the respective waveguides come in contact, and the center axes of the waveguides substantially coincide.

9. An optical waveguide device as defined in claim 8, wherein the angle formed by the center axis of the through-slot and the terminal edge is a substantially right angle.

10. An optical waveguide device as defined in claim 8, wherein the width of the through-slot is slightly smaller, with a trapezoidal geometry, than the thickness of the matching device, so that when the optical waveguide device is connected to the matching device through coupling of their respective through-slots, a secure fit is accomplished.

11. An optical waveguide device as defined in claim 10, coupled with the matching similar device through an adhesive photopolymer composition.

12. An optical waveguide device as defined in claim 8, coupled with a second similar device through an adhesive photopolymer composition.

13. An optical waveguide device as defined in claim 8, comprising a laminate of a middle photopolymer layer containing the waveguide, and two external photopolymer layers having the same thickness.

14. An optical waveguide device as defined in claim 13, coupled with the matching similar device through an adhesive photopolymer composition.

15. A method of coupling two optical waveguide devices, each optical device having a thickness, a pair of opposite surfaces, and a waveguide positioned equidistantly between the opposite surfaces, the waveguide having a direction, an end-point and a center-axis, comprising the steps of:

forming a through-slot in a direction substantially parallel to the direction of the waveguide; and inserting the through-slot of one device into a through-slot of the second device in a way that the end-points of the respective waveguides come in contact, and the center axes of the waveguides substantially coincide.

16. A method as defined in claim 15, wherein the forming step of the through-slot is conducted by ablating with a laser.

17. A method as defined in claim 16, wherein the laser is an excimer laser.

18. A method as defined in claim 15, wherein the width of the through-slot of each device is substantially equal to the thickness of the respective device.

19. A method as defined in claim 15, wherein the width of the through-slot of each device is adequately smaller than the thickness of the respective device, so that when the two optical waveguide devices are coupled, a tight and secure fit is created.

20. A method as defined in claim 19, further comprising the step of adhering the respective waveguide ends of the two devices to each other with an adhesive photopolymer composition.

21. A method as defined in claim 15, further comprising the step of adhering the respective waveguide ends of the two devices to each other with an adhesive photopolymer composition.

22. A method as defined in claim 15, wherein at least one of the optical waveguide devices comprises a laminate of a middle photopolymer layer containing the waveguide, and two external photopolymer layers having the same thickness.

23. A method as defined in claim 22, further comprising the step of adhering the respective waveguide ends of the two devices to each other with an adhesive photopolymer composition.

24. A method of coupling two optical waveguide devices, each optical device having a terminal edge, a first pair of opposite surfaces substantially parallel to each other, and a waveguide positioned equidistantly between the opposite surfaces, the waveguide having a center axis forming an angle with the terminal edge different than zero, comprising the steps of:

forming a through-slot in a direction substantially parallel to the direction of the waveguide, the through-slot starting at the terminal edge of each device and extending adequately within the device to remove at least part of the waveguide and form an end on the waveguide, in a way that the through-slot has a center axis coinciding with the center axis of the waveguide, a second pair of opposite side surfaces, substantially parallel to each other and to the center axis of the waveguide, and substantially perpendicular to the first pair of surfaces with the requirement that the width of the through-slot is not excessively smaller than the thickness of the device, and an internal surface meeting with and being perpendicular to the second pair of surfaces, the internal surface having a center point, the center point coinciding with the end of the waveguide; and inserting the slot of one device into a similar slot of a second device in a way that the ends of the respective waveguides come in contact, and the center axes of the waveguides substantially coincide.

25. A method as defined in claim 24, wherein the forming step of the through-slot is conducted by ablating with a laser.

26. A method as defined in claim 25, wherein the laser is an excimer laser.

27. A method as defined in claim 24, wherein the angle formed by the center axis of the through-slot and the terminal edge is a substantially right angle.

28. A method as defined in claim 24, wherein he width of the through-slot of each device is substantially equal to the thickness of the respective device.

29. A method as defined in claim 24, wherein the width of the through-slot of each device is adequately smaller than the thickness of the respective device in a trapezoidal manner, so that when the two optical waveguide devices are coupled, a tight and secure fit is created.

30. A method as defined in claim 29, further comprising the step of adhering the respective waveguide ends of the two devices to each other with an adhesive photopolymer composition.

31. A method as defined in claim 24, further comprising the step of adhering the respective waveguide ends of the two ,devices to each other with an adhesive photopolymer composition.

32. A method as defined in claim 24, wherein at least one of the optical waveguide devices comprises a laminate of a middle photopolymer layer containing the waveguide, and two external photopolymer layers having the same thickness.

33. A method as defined in claim 32, further comprising the step of adhering the respective waveguide ends of the two devices to each other with an adhesive photopolymer composition.

* * * * *